(12) United States Patent
Kuroiwa et al.

(10) Patent No.: US 9,197,532 B2
(45) Date of Patent: Nov. 24, 2015

(54) COMMUNICATION ANALYSIS APPARATUS AND COMMUNICATION ANALYSIS METHOD

(71) Applicant: Mitsubishi Electric Corporation, Chiyoda-ku (JP)

(72) Inventors: Takeru Kuroiwa, Tokyo (JP); Masanori Nakata, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 207 days.

(21) Appl. No.: 13/965,520

(22) Filed: Aug. 13, 2013

(65) Prior Publication Data

US 2013/0329568 A1    Dec. 12, 2013

Related U.S. Application Data

(62) Division of application No. 12/812,827, filed as application No. PCT/JP2009/050918 on Jan. 22, 2009, now Pat. No. 8,542,722.

(30) Foreign Application Priority Data

Feb. 1, 2008  (JP) ................................ 2008-022489
Apr. 14, 2008  (JP) ................................ 2008-104274

(51) Int. Cl.
*H04L 12/26*    (2006.01)
*H04L 1/24*    (2006.01)

(52) U.S. Cl.
CPC *H04L 43/50* (2013.01); *H04L 1/24* (2013.01); *H04L 43/026* (2013.01)

(58) Field of Classification Search
CPC ... H04B 1/715; H04W 88/06; H04L 12/5692; H04L 43/50; H04L 1/24; H04L 43/026
See application file for complete search history.

(56) References Cited

U.S. PATENT DOCUMENTS 5,105,444 A     4/1992  Gard
5,577,067 A  *  11/1996  Zimmerman ................. 375/224
(Continued)

FOREIGN PATENT DOCUMENTS

CN          1942925 A       4/2007
EP        0 265 106 A2      4/1988
(Continued)

OTHER PUBLICATIONS

International Search Report (PCT/ISA/210) dated May 12, 2009.
(Continued)

*Primary Examiner* — Curtis Odom
(74) *Attorney, Agent, or Firm* — Buchanan Ingersoll & Rooney PC

(57) ABSTRACT

To obtain a communication analysis apparatus and a communication analysis method that are allowed to analyze a communication message and a waveform signal in such a manner that the communication message and waveform signal are associated with each other. A communication analysis apparatus includes division organization information addition means for adding, to a plurality of division data obtained by dividing data into predetermined lengths, division organization information 300 including a division unit 3011 for defining the predetermined lengths and a division position 3013 that is information about the start position and end position of division data in the data.

15 Claims, 9 Drawing Sheets

(56) References Cited

U.S. PATENT DOCUMENTS

| | | |
|---|---|---|
| 6,996,623 B1 | 2/2006 | Kawano et al. |
| 7,403,560 B2 | 7/2008 | Gamper et al. |
| 2001/0046222 A1 | 11/2001 | Hoshiko |
| 2003/0135525 A1 | 7/2003 | Huntington et al. |
| 2005/0175079 A1 | 8/2005 | Gamper et al. |
| 2006/0109863 A1 | 5/2006 | Regnier |
| 2007/0070691 A1 | 3/2007 | Walvis et al. |
| 2007/0223393 A1* | 9/2007 | Urushihara et al. .......... 370/252 |
| 2008/0184087 A1 | 7/2008 | Hayashi |

FOREIGN PATENT DOCUMENTS

| | | |
|---|---|---|
| EP | 1 351 446 A1 | 10/2003 |
| EP | 1 562 131 A2 | 8/2005 |
| JP | 60-148696 U | 10/1985 |
| JP | 10-209978 A | 8/1998 |
| JP | 2001-111531 A | 4/2001 |
| JP | 2001-148837 A | 5/2001 |
| JP | 2001-339473 A | 12/2001 |
| JP | 2003-273963 A | 9/2003 |
| JP | 2005-311570 A | 11/2005 |
| JP | 2006-33007 A | 2/2006 |
| JP | 2006-245972 A | 9/2006 |
| WO | WO 2005/081728 A2 | 9/2005 |

OTHER PUBLICATIONS

Office Action (Notification of Reasons for Refusal) dated Jan. 24, 2012, issued in the corresponding Japanese Patent Application No. 2008-022489, and an English Translation thereof. (5 pages).

Extended Search Report from European Patent Office issued in corresponding European Patent Application No. 10007183.6 dated Dec. 30, 2010.

Extended Search Report from European Patent Office issued in corresponding European Patent Application No. 10007182.8 dated Dec. 22, 2010.

Extended Search Report from European Patent Office issued in corresponding European Patent Application No. 09705319.3 dated Dec. 30, 2010.

Office Action from Chinese Patent Office dated Sep. 13, 2012, issued in corresponding Chinese Patent Application No. 200980103519.X, with English translation thereof.

European Office Action (Communication Pursuant to Articles 94(3) EPC) issued on Jan. 27, 2015, by the European Patent Office in corresponding European Patent Application No. 09 705 319.3-1853. (8 pages).

European Office Action (Communication Pursuant to Articles 94(3) EPC) issued on Jan. 27, 2015, by the European Patent Office in corresponding European Patent Application No. 10 007 183.6-1853. (7 pages).

* cited by examiner

FIG. 12

| PART | COMMUNICATION STATE VALUE (INDICATING QUALITATIVE STATE) | CHARACTERISTIC AMOUNT TO BE ESTIMATED | COMPARISON VALUE (CRITERION FOR QUANTITATIVE ESTIMATION) |
|---|---|---|---|
| TRANSMISSION PATH | LENGTH OF TRANSMISSION PATH EXCEEDS DISTANCE PRESCRIBED IN COMMUNICATION SPECIFICATION | POWER OF FREQUENCY RANGE USED IN COMMUNICATION | DIFFERENCE VALUE ITSELF (NOTE THAT IDEAL > ANALYSIS) |
| | TRANSMISSION PATH HAS MANY BRANCHES | PHASE COMPONENT OF FREQUENCY RANGE USED IN COMMUNICATION | DIFFERENCE VALUE ITSELF |
| | TRANSMISSION LINES ARE TOO ADJACENT TO ONE ANOTHER | POWER OF FREQUENCY RANGE USED IN COMMUNICATION | DIFFERENCE VALUE ITSELF (NOTE THAT IDEAL < ANALYSIS) |
| | GROUND FAULT OCCURS | DISTRIBUTION OF AMPLITUDE OF WAVEFORM SIGNAL | RATIO OF ANALYSIS TO IDEAL (NOTE THAT IDEAL < ANALYSIS) |
| | SHORT CIRCUIT OCCURS | AMPLITUDE OF WAVEFORM SIGNAL | RATIO OF ANALYSIS TO IDEAL (NOTE THAT IDEAL < ANALYSIS) |
| TRANSMISSION /RECEPTION TERMINAL | TERMINAL FAILS | POWER OF FREQUENCY RANGE USED IN COMMUNICATION | DIFFERENCE VALUE ITSELF (NOTE THAT IDEAL > ANALYSIS) |
| | NUMBER OF CONNECTED TERMINALS EXCEEDS NUMBER OF UNITS PRESCRIBED IN COMMUNICATION SPECIFICATION | BASELINE OF WAVEFORM SIGNAL | RATIO OF ANALYSIS TO IDEAL (NOTE THAT IDEAL > ANALYSIS) |
| NOISE SOURCE | NOISE SOURCE EXISTS NEAR TRANSMISSION PATH | POWER OF FREQUENCY RANGE NOT USED IN COMMUNICATION | DIFFERENCE VALUE ITSELF (NOTE THAT IDEAL > ANALYSIS) |
| OTHER PARTS | TERMINATING RESISTOR IN TERMINAL FAILS | POWER OF FREQUENCY RANGE USED IN COMMUNICATION | RATIO OF ANALYSIS TO IDEAL (NOTE THAT IDEAL > ANALYSIS) |
| | SIGNAL ATTENUATION OBJECT IS CONNECTED TO TRANSMISSION PATH | AMPLITUDE OF WAVEFORM SIGNAL | RATIO OF ANALYSIS TO IDEAL (NOTE THAT IDEAL > ANALYSIS) |

COMMUNICATION ANALYSIS APPARATUS AND COMMUNICATION ANALYSIS METHOD

TECHNICAL FIELD

The present invention relates to a communication analysis apparatus and a communication analysis method for supporting an analysis of a transmission failure of a network.

BACKGROUND ART

If the shape of a waveform signal passing through a transmission path is disturbed for some reason and thus the signal intended by the command source cannot be maintained until the signal reaches the command destination, a network transmission failure occurs. Therefore, an analysis of a physical layer level of the network is required as a diagnosis of such a transmission failure.

As a related-art example of a waveform signal analysis and as a related-art example intended to easily conduct a communication analysis by presenting a communication sequence and a physical amount in such a manner that the communication sequence and physical amount are associated with each other, for example, there has been proposed a communication test apparatus where "display means 108 disposes and displays, in chronological order, the sequence log display and power log display 9 showing the presence or absence of a communication from the power log information in a distinguishable manner" (for example, see Patent Document 1).

Also, as a related-art example intended to detect a communication interference wave by controlling a parameter as appropriate with respect to display of an analysis result, for example, there has been proposed a digital modulation signal evaluation apparatus where "a threshold setup unit 37 obtains a threshold R for determining the presence or absence of an interference wave on the basis of a modulation error ratio of a sub-carrier not included in an interference range expected to be interfered with by a interference wave among stored modulation error ratios and a determination unit 38 compares the threshold R with the modulation error ratio of the sub-carrier included in the interference range so as to determine whether there is an interference wave, and displays a result of the determination" (for example, see Patent Document 2).

Among related-art examples of a physical layer level analysis are the above-mentioned Patent Document 1 and a transmission signal analysis apparatus (for example, see Patent Document 3) that previously sets an ideal pilot signal for an OFDM-type transmission signal and analyzes an actual pilot signal using the ideal pilot signal.

RELATED-ART DOCUMENTS

Patent Documents

[Patent Document 1] Japanese Unexamined Patent Application Publication No. 2006-33007 (Claim 4, pp. 15 to 21, FIGS. 1 to 2)
[Patent Document 2] Japanese Unexamined Patent Application Publication No. 2005-311570 (ABSTRACT)
[Patent Document 3] Japanese Unexamined Patent Application Publication No. 2006-245972 (pp. 6 to 7, FIGS. 1 to 6)

SUMMARY OF THE INVENTION

Problems to be Solved by the Invention

In the related-art failure analyses, an apparatus for analyzing communication messages and an apparatus for analyzing waveform signals exist independently. This causes a problem that it is not easy to analyze a failure in such a manner that a communication message and a waveform signal are associated with each other and thus the workload is increased.

While there are multiple waveform signal analysis techniques such as the power spectrum analysis, constellation analysis, or MER (modulation error ratio) analysis, analysis functions are independent of one another in related-art apparatuses. This causes a problem that it is difficult to read an association between analysis results.

In the related-art failure analyses, a worker can estimate the communication state qualitatively by observing a voltage level, a frequency component, an in-phase component and an out-of-phase component, or the like of a waveform signal passing through a transmission path. However, it is not easy for the worker to estimate the communication state quantitatively. Therefore, if a failure occurs on a network, only experts having expertise or experience about communication protocols or waveform signals can cope with the failure.

The present invention was made to solve the above-mentioned problems and an object of the invention is to obtain a communication analysis apparatus and a communication analysis method that are allowed to analyze a communication message and a waveform signal in such a manner that the communication message and waveform signal are associated with each other.

Another object of the invention is to obtain a communication analysis apparatus that determines the network state quantitatively to conduct the analysis work efficiently so that a worker can easily identify a cause of a transmission failure or a failure occurrence location and cope with the failure even if the worker does not have expertise or experience about communication protocols or waveform signals.

Means for Solving the Problems

A communication analysis apparatus according to the present invention is a communication analysis apparatus for analyzing data acquired from a transmission path of a communication network and includes division organization information addition means for adding division organization information to a plurality of pieces of division data, the pieces of division data being obtained by dividing the data into predetermined lengths, the division organization information including division unit information for defining the predetermined lengths and division position information, the division position information being information about a start position and an end position of the pieces of division data in the data.

Also, an communication analysis apparatus according to the present invention is a communication analysis apparatus connected to a source terminal or a destination terminal of an analysis waveform signal or connected to a transmission path linking the source terminal and destination terminal and includes: analysis waveform information generation means for generating analysis waveform information including a waveform signal on the basis of a waveform signal that is an analysis subject transmitted through a transmission path and adheres to a predetermined communication protocol; storage means including an ideal waveform signal adhering to a communication protocol; and communication state determination means. The analysis waveform information generation means extracts a portion of a waveform signal as an analysis waveform signal that is an analysis subject, the portion corresponding to the ideal waveform signal stored in the storage means. The communication state determination means compares the analysis waveform signal extracted by the analysis waveform information generation means with the ideal waveform signal stored in the storage means, and estimates the communication state of the transmission path on the basis of a result of the comparison.

Advantages

The present invention allows analyzing a communication message and a waveform signal in such a manner that the communication message and waveform signal are associated with each other, by adding division organization information including division unit information and division position information to multiple pieces of division data obtained by dividing data into predetermined lengths.

Also, since the communication analysis apparatus according to the present invention automatically determines the network state, a worker can easily identify a cause of a transmission failure or a failure occurrence location and cope with the failure even if the worker does not have expertise or experience about communication protocols or waveform signals.

BRIEF DESCRIPTION OF DRAWINGS

FIG. 12 is a drawing showing the contents of quantitative estimations made by communication state determination means 113A.

REFERENCE NUMERALS 100 communication analysis apparatus
101 communication means
102 waveform measuring means
103 division organization information-added communication message storage means
104 division organization information-added waveform signal storage means
105 communication unit division organization information addition means
106 communication unit synchronization determination means
1061 communication unit synchronization determination condition
107 modulation unit division organization information addition means
108 modulation unit synchronization determination means
1081 modulation unit synchronization determination condition
109 communication analysis means
1091 communication analyzer
10911 communication analyzer label
10912 communication analysis subject
10913 communication analysis unit
10921 communication analyzer label
110 waveform analysis means
1101 waveform analyzer
11011 waveform analyzer label
11012 waveform analysis subject
11013 waveform analysis unit
111 division organization information-added display data generation means
1111 display data generator
11111 display data label
11112 generation subject
11113 generation unit
112 division organization information-added display data storage means
113 display data specification means
114 association ID display data extraction means
115 analysis result display means
200 division organization information-added measurement data
200a division organization information-added communication message
200b division organization information-added waveform signal
200c division organization information-added display data
201 measurement data
201a communication message
201b waveform signal
201c display data
202 measurement data information
202a1 message acquisition time
202b1 waveform acquisition time
202b2 sampling rate
202c2 generation subject range
203 division organization information processing flag
203a1 communication unit extraction flag
203a2 communication unit synchronization determination flag
203a3 modulation unit extraction flag
203a4 modulation unit synchronization determination flag
203a5 communication analysis flag
203b1 communication unit extraction flag
203b2 communication unit synchronization determination flag
203b3 modulation unit extraction flag
203b4 modulation unit synchronization determination flag
203b5 waveform analysis flag
300 division organization information 300a1 message communication unit division organization information
300a2 message modulation unit division organization information
300b1 waveform communication unit division organization information
300b2 waveform modulation unit division organization information
300c1 display division organization information
300c2 selection division organization information
301 basic information
3011 division unit
3012 basic ID
3013 division position
3014 division time
3015 measurement data type
302 associated information
3021 association ID
303 analysis information
3031 analysis label
3032 analysis value
100A communication analysis apparatus
101A communication means
102A waveform measuring means
103A division organization information-added communication message storage means
104A division organization information-added waveform signal storage means
105A message division organization information addition means
106A waveform division organization information addition means
107A message analysis means
108A synchronization determination means
114A analysis result display means
200A division organization information-added data
200aA division organization information-added communication message
200bA division organization information-added waveform signal
201A data
201aA communication message
201bA waveform signal
202A data information
202a1A message acquisition time
202b1A waveform acquisition time
203A division organization information processing flag
203a1A communication unit extraction flag
203a2A message analysis flag
203a3A synchronization determination flag
203b1A communication unit extraction flag
203b2A synchronization determination flag
300A division organization information
300aA message division organization information
300bA waveform division organization information
301A basic information
302A associated information
303A analysis information
400aA analysis waveform information
400bA ideal waveform information
401aA analysis part waveform signal
402aA characteristic amount label
403aA characteristic amount
404aA communication state value
1071A message analyzer
10711A message analyzer label
10712A message analysis subject
1091A analysis part determination table
1111A characteristic amount calculator
11111A characteristic amount label
11112a calculation subject data
1131A communication state determination table
3011A division unit
3012A basic ID
3013A division position
3014A division time
3015A data type
3021A association ID
3031A analysis label
3032A analysis value
10911A analysis part start position
10912A analysis part end position Best Modes for Carrying out the Invention First Embodiment
As shown in FIG. 1, the communication analysis apparatus 100 for analyzing data acquired from a transmission path of a communication network includes a communication means 101, a waveform measuring means 102, a division organization information-added communication message storage means 103, a division organization information-added waveform signal storage means 104, a communication unit division organization information addition means 105, a communication unit synchronization determination means 106, a modulation unit division organization information addition means 107, a modulation unit synchronization determination means 108, a communication analysis means 109, a waveform analysis means 110, a division organization information-added display data generation means 111, a division organization information-added display data storage means 112, a display data specification means 113, an association ID display data extraction means 114, and one or more analysis result display means 115.

Figure 1:
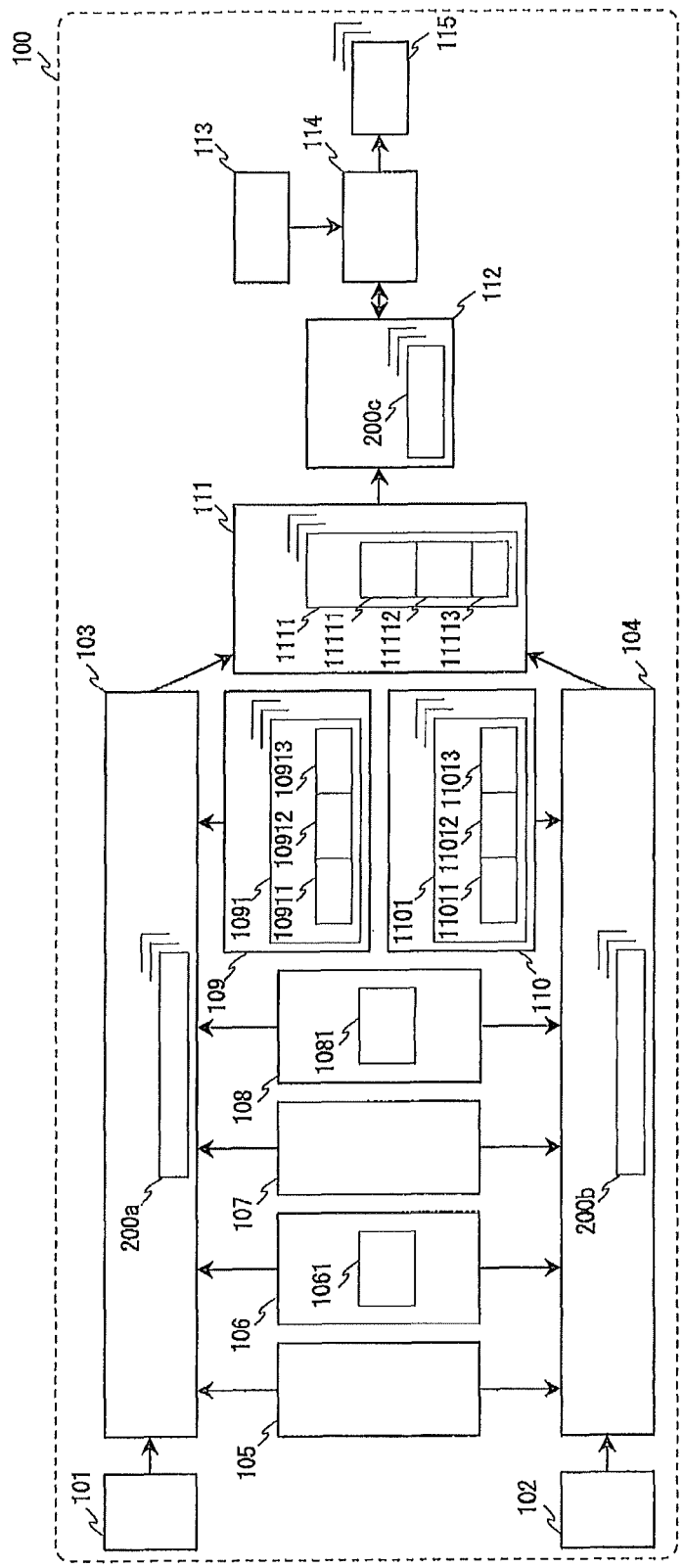
FIG. 1 is a diagram showing a configuration of a communication analysis apparatus 100 according to a first embodiment of the present invention.

Any network such as in-house communication, power line communication, wireless communication, or inter-control apparatus communication may be used as a communication network. Also, an air-conditioner may be used as a control apparatus in inter-control apparatus communications. Also, a transmission path of a network may be wired or wireless.

The communication unit division organization information addition means 105 or modulation unit division organization information addition means 107 corresponds to division organization information addition means according to the present invention.

The division organization information-added communication message storage means 103 or division organization information-added waveform signal storage means 104 corresponds to division organization information-added data generation means according to the present invention.

The communication unit synchronization determination means 106 or modulation unit synchronization determination means 108 corresponds to synchronization determination means according to the present invention.

The division organization information-added communication message storage means 103, division organization information-added waveform signal storage means 104, and communication unit synchronization determination means 106, or modulation unit synchronization determination means 108 correspond to data synchronization means according to the present invention.

The communication analysis means 109 or waveform analysis means 110 corresponds to signal analysis means according to the present invention.

The division organization information-added display data storage means 112 corresponds to display range data storage means according to the present invention.

The association ID display data extraction means 114 corresponds to association display data extraction means according to the present invention.

The division organization information-added display data storage means 112, display data specification means 113, association ID display data extraction means 114, and analysis result display means 115 correspond to signal analysis result display means according to the present invention.

The division organization information-added communication message storage means 103 stores one or more division organization information-added communication messages 200*a*.

The division organization information-added waveform signal storage means 104 stores one or more division organization information-added waveform signals 200*b*.

The communication unit synchronization determination means 106 has a communication unit synchronization determination condition 1061.

The modulation unit synchronization determination means 108 has a modulation unit synchronization determination condition 1081.

The communication analysis means 109 includes one or more communication analyzers 1091. The communication analyzers 1091 include a communication analyzer label 10911, a communication analysis subject 10912, and a communication analysis unit 10913. The communication analyzers 1091 may be any analyzers such as an address analyzer for deriving the destination address or source address of a communication message or a CRC error determination apparatus for deriving a CRC error of a communication message.

The waveform analysis means 110 includes one or more waveform analyzers 1101. The waveform analyzers 1101 include a waveform analyzer label 11011, a waveform analysis subject 11012, and a waveform analysis unit 11013. The waveform analyzers 1101 may be any analyzers such as a Fourier transformer for deriving a frequency component of a waveform signal, an I-Q calculator for deriving an in-phase component and an out-of-phase component of a waveform signal, an MER calculator for deriving the fluctuation amounts of an in-phase component and an out-of-phase component, a disturbance diagnostic apparatus for inferring a disturbing factor of a waveform signal, or a spectrum calculator for calculating a power spectrum of a waveform signal.

The division organization information-added display data generation means 111 includes one or more display data generators 1111. The display data generators 1111 have a display data label 11111, a generation subject 11112, and a generation unit 11113.

The division organization information-added display data storage means 112 stores one or more pieces of division organization information-added display data 200*c*.

The analysis result display means 115 may be any display means such as a spectrum display means for displaying a power spectrum of a waveform signal, a constellation display means for displaying an in-phase component and an out-of-phase component of a waveform signal, an MER display means for displaying an MER of a waveform signal, or a disturbance display means for displaying an inference result of a disturbance factor of a waveform signal.

Figure 2:
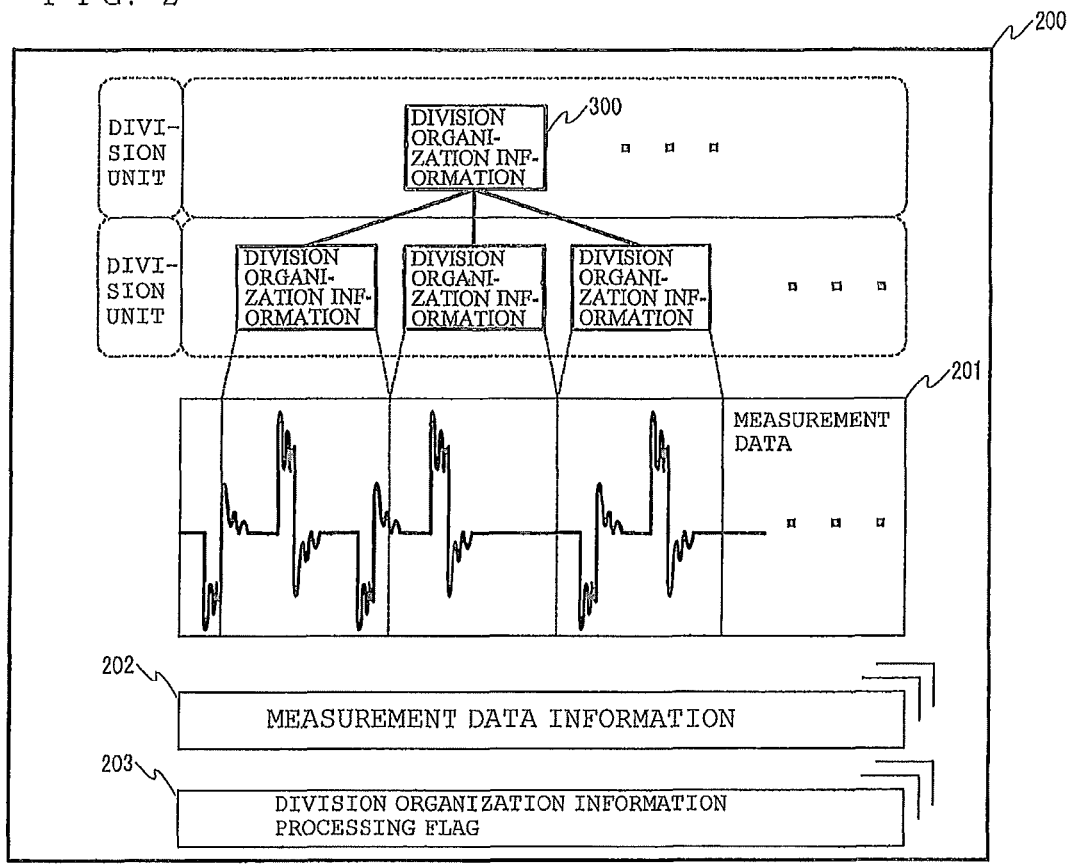
FIG. 2 is a diagram showing a configuration of division organization information-added measurement data 200 according to the first embodiment of the present invention.

FIG. 2 is a diagram showing a configuration of division organization information-added measurement data 200 according to the first embodiment of the present invention. As shown in FIG. 2, the division organization information-added measurement data 200 includes zero or more pieces of division organization information 300, one or more pieces of measurement data 201, zero or more pieces of measurement data information 202 that are pieces of data information, and zero or more division organization information processing flags 203.

Figure 3:
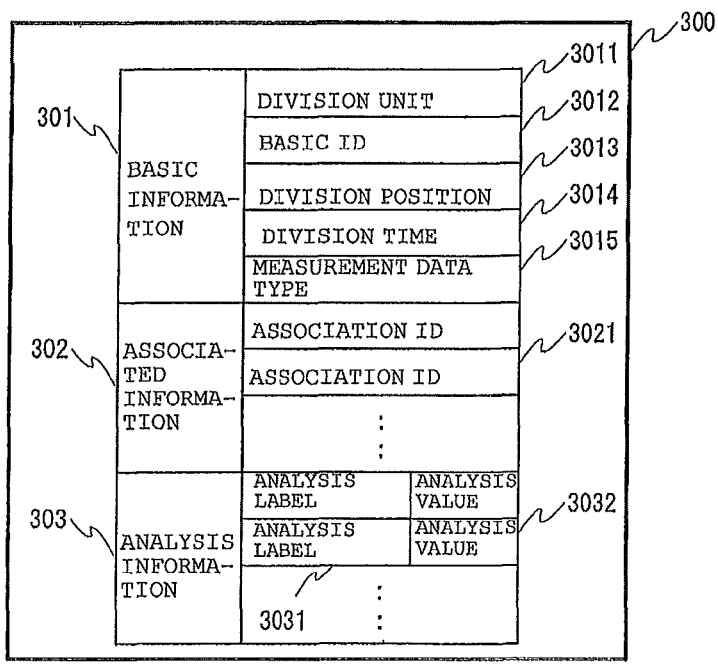
FIG. 3 is a diagram showing a configuration of division organization information 300 according to the first embodiment of the present invention.

FIG. 3 is a diagram showing a configuration of the division organization information 300 according to the first embodiment of the present invention. As shown in FIG. 3, the division organization information 300 includes basic information 301, associated information 302, and analysis information 303.

The basic information 301 includes a division unit 3011 that is division unit information, a basic ID 3012, a division position 3013, a division time 3014 that is division position information, and a measurement data type 3015.

The associated information 302 includes zero or more association IDs 3021.

The analysis information 303 includes zero or more sets of an analysis label 3031 and an analysis value 3032.

Configurations of the above-mentioned division organization information-added communication messages 200*a*, division organization information-added waveform signals 200*b*, and division organization information-added display data 200*c* imitate a configuration of the division organization information-added measurement data 200.

That is, the division organization information-added communication messages 200*a* include, as division organization information 300, message communication unit division organization information 300*a*1 where the division unit 3011 is the communication unit and message modulation unit division organization information 300*a*2 where the division unit 3011 is the modulation unit.

Also, the division organization information-added communication messages 200*a* include a communication message 201*a* as measurement data 201.

Also, the division organization information-added communication messages 200*a* include a message acquisition time 202*a*1 as measurement data information 202.

Also, the division organization information-added communication messages 200*a* include, as division organization information processing flags 203, a communication unit extraction flag 203*a*1, a communication unit synchronization determination flag 203*a*2, a modulation unit extraction flag 203*a*3, a modulation unit synchronization determination flag 203*a*4, and a communication analysis flag 203*a*5.

Operations for generating each information will be described later.

The division organization information-added waveform signals 200*b* include, as division organization information 300, waveform communication unit division organization information 300*b*1 where the division unit 3011 is the communication unit and waveform modulation unit division organization information 300*b*2 where the division unit 3011 is the modulation unit.

Also, the division organization information-added waveform signals 200*b* include a waveform signal 201*b* as measurement data 201.

Also, the division organization information-added waveform signal 200*b* includes a waveform acquisition time 202*b*1 and a sampling rate 202*b*2 as measurement data information 202.

Also, the division organization information-added waveform signal 200*b* includes, as division organization information processing flags 203, a communication unit extraction flag 203*b*1, a communication unit synchronization determination flag 203*b*2, a modulation unit extraction flag 203*b*3, a modulation unit synchronization determination flag 203*b*4, and a waveform analysis flag 203*b*5.

Operations for generating each information will be described later.

The above-mentioned flags are set by the communication unit division organization information addition means 105, communication unit synchronization determination means 106, modulation unit division organization information addition means 107, modulation unit synchronization determination means 108, communication analysis means 109, and waveform analysis means 110 by performing operations to be described later.

The division organization information-added display data 200*c* includes, as division organization information 300, display division organization information 300*c*1 where the division unit 3011 is a display range number (to be described later) and selection division organization information 300*c*2 where the division unit 3011 is a display range number (to be described later).

Also, the division organization information-added display data 200*c* includes display data 201*c* as measurement data 201.

Also, the division organization information-added display data 200*c* includes, as measurement data information 202, a display data label 11111 and a generation subject range 202*c*2.

Next, operations of the communication analysis apparatus 100 will be described.

Processes performed by the communication analysis apparatus 100 according to this embodiment are broadly classified into three procedures: a measurement procedure 1A; an analysis and synchronization procedure 1B; and an analysis result display procedure 1C. Hereafter, the above-mentioned procedures 1A to 1C will be described.

First, the measurement procedure 1A will be described.

The communication means 101 is connected to a wired or wireless transmission path. The communication means 101 acquires a communication message 201*a* transmitted or received by an apparatus connected to the transmission path one after another, records a message acquisition time 202*a*1 that is original measurement data acquisition time information indicating the time when the communication message 201*a* has been acquired, and notifies the division organization information-added communication message storage means 103 of the communication message 201*a* and message acquisition time 202*a*1.

The communication analysis apparatus 100 may include one or more communication means 101 and each communication means 101 may acquire a communication message 201*a* adhering to a different communication protocol.

The waveform measuring means 102 is connected to a wired or wireless transmission path. The waveform measuring means 102 acquires a waveform signal 201*b* transmitted or received by an apparatus connected to the transmission path one after another at an arbitrary sampling rate 202*b*2, records a waveform acquisition time 202*b*1 that is original measurement data acquisition time information indicating the time when the waveform signal 201*b* has been acquired, and notifies the division organization information-added waveform signal storage means 104 of the waveform signal 201*b*, waveform acquisition time 202*b*1, and sampling rate 202*b*2.

The communication analysis apparatus 100 may include one or more waveform measuring means 102 and each waveform measuring means 102 may acquire a waveform signal 201*b* having a different sampling rate 202*b*2.

Each time the division organization information-added communication message storage means 103 is notified of a communication message 201*a* as division measurement data by the communication means 101, it newly generates a division organization information-added communication message 200*a*, incorporates the communication message 201*a* as the measurement data 201 and message acquisition time 202*a*1 as measurement data information 202 into the division organization information-added communication messages 200*a*, and then stores the division organization information-added communication messages 200*a*.

Each time the division organization information-added waveform signal storage means 104 is notified of a waveform signal 201*b* as division measurement data by the waveform measuring means 102, it newly generates a division organization information-added waveform signal 200*b*, stores the waveform signal 201*b* as measurement data 201, stores the waveform acquisition time 202*b*1 and sampling rate 202*b*2 as measurement data information 202, and then memorizes the division organization information-added waveform signal 200*b*.

Figure 4:
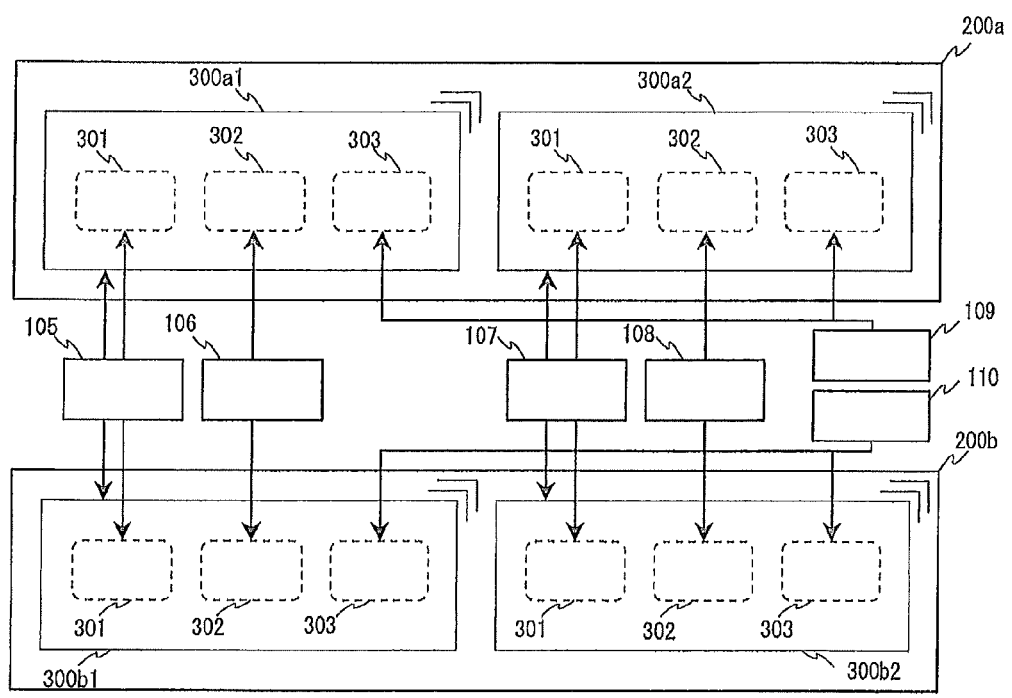
FIG. 4 is diagram showing operations in an analysis and synchronization procedure 1B according to the first embodiment of the present invention.
Figure 5:
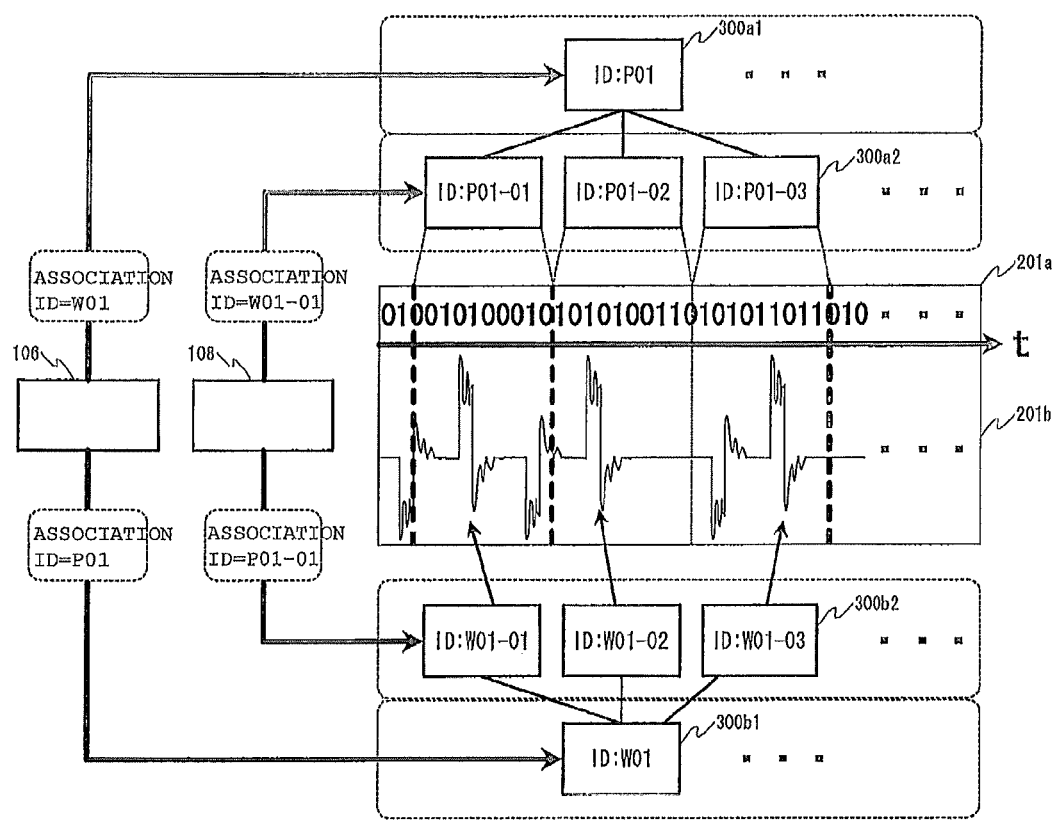
FIG. 5 is a diagram showing a method for associating a communication message 201a and a waveform signal 201b with each other using the division organization information 300 according to the first embodiment of the present invention.

FIG. 4 is diagram showing operations in the analysis and synchronization procedure 1B according to the first embodiment of the present invention. FIG. 5 is a diagram showing a method for associating communication message 201*a* and a waveform signal 201*b* with each other using division organization information 300 according to the first embodiment of the present invention.

Hereafter, the analysis and synchronization procedure 1B will be described.

The division organization information-added communication message storage means 103 notifies the communication unit division organization information addition means 105 of a division organization information-added communication message 200*a* where a communication unit extraction flag 203*a*1 is not set, among the stored division organization information-added communication messages 200*a*.

The division organization information-added communication message storage means 103 notifies the communication unit synchronization determination means 106 of a division organization information-added communication message 200*a* where a communication unit extraction flag 203*a*1 is set and a communication unit synchronization determination flag 203*a*2 is not set.

The division organization information-added communication message storage means 103 notifies the modulation unit division organization information addition means 107 of a division organization information-added communication message 200*a* where a communication unit synchronization determination flag 203*a*2 is set and a modulation unit extraction flag 203*a*3 is not set.

The division organization information-added communication message storage means 103 notifies the modulation unit synchronization determination means 108 of a division organization information-added communication message 200*a* where a modulation unit extraction flag 203*a*3 is set and a communication analysis flag 203*a*4 is not set.

The division organization information-added communication message storage means 103 notifies the communication analysis means 109 of a division organization information-added communication message 200*a* where a modulation unit synchronization determination flag 203*a*4 is set and a communication analysis flag 203*a*5 is not set.

It is assumed that each time the above-mentioned flags are set by performing an operation to be described later, the corresponding above-mentioned means is notified of a division organization information-added communication message 200a.

The division organization information-added waveform signal storage means 104 notifies the communication unit division organization information addition means 105 of a division organization information-added waveform signal 200b where a communication unit extraction flag 203b1 is not set, among the stored division organization information-added waveform signals 200b.

The division organization information-added waveform signal storage means 104 notifies the communication unit synchronization determination means 106 of a division organization information-added waveform signal 200b where a communication unit extraction flag 203b1 is set and a communication unit synchronization determination flag 203b2 is not set.

The division organization information-added waveform signal storage means 104 notifies the modulation unit division organization information addition means 107 of a division organization information-added waveform signal 200b where a communication unit synchronization determination flag 203b2 is set and a modulation unit extraction flag 203b3 is not set.

The division organization information-added waveform signal storage means 104 notifies the modulation unit synchronization determination means 108 of a division organization information-added waveform signal 200b where a modulation unit extraction flag 203b3 is set and a modulation unit synchronization determination flag 203b4 is not set.

The division organization information-added waveform signal storage means 104 notifies the waveform analysis means 110 of a division organization information-added waveform signal 200b where a modulation unit synchronization determination flag 203b4 is set and a waveform analysis flag 203b5 is not set.

It is assumed that each time the above-mentioned flags are set by performing an operation to be described later, the corresponding above-mentioned means is notified of a division organization information-added communication message 200a.

The communication unit division organization information addition means 105 sets the communication unit extraction flag 203a1 included in the notified division organization information-added communication message 200a and derives the start position and end position of the communication unit included in the communication message 201a and a communication protocol adhered to by the communication message 201a.

Each time the communication unit division organization information addition means 105 derives the start position and end position, it generates a message communication unit division organization information 300a1 and stores basic information 301.

Specifically, the communication unit division organization information addition means 105 generates a basic ID 3012 that is an ID (identification) unique to the message communication unit division organization information 300a1 and derives a start time corresponding to the start position and an end time corresponding to the end position on the basis of the message acquisition time 202a1.

The communication unit division organization information addition means 105 sets the communication unit for the division unit 3011 of the basic information 301, stores the generated basic ID 3012, stores the derived start position and end position in the division time, stores the derived start time and end time in the division time 3014, and stores the derived communication protocol in the measurement data type 3015.

As for the start position and end position, the communication unit division organization information addition means 105 may derive them from a downtime of the communication message 201a or may derive them by extracting a start bit and a stop bit.

As for the communication protocol, the communication unit division organization information addition means 105 may include a table for associating message header formats and communication protocols with each other and may derive the communication protocol from the table. Also, the communication analysis apparatus 100 may include a communication means 101 for each communication protocol and the communication unit division organization information addition means 105 may derive the communication protocol by distinguishing a communication means 101 that is the notification source of the communication message 201a.

The communication unit division organization information addition means 105 sets the communication unit extraction flag 203b1 included in the notified division organization information-added waveform signal 200b and derives the start position and end position of the communication unit from the waveform signal 201b.

Each time this start position and end position are extracted, the communication unit division organization information addition means 105 generates waveform communication unit division organization information 300b1 and stores basic information 301 included in the waveform communication unit division organization information 300b1.

Specifically, the communication unit division organization information addition means 105 generates an basic ID 3012 unique to the waveform communication unit division organization information 300b1 and derives a start time corresponding to the start position and an end time corresponding to the end position on the basis of the waveform acquisition time 202b1 and sampling rate 202b2.

Then, the communication unit division organization information addition means 105 sets the communication unit for the division unit 3011 of the basic information 301, stores the generated basic ID 3012, stores the derived start position and end position in the division position 3013, and stores the derived start time and end time in the division time 3014.

As for the start position and end position, the communication unit division organization information addition means 105 may have a level threshold and derive the start position and end position by comparing the level of the waveform signal 201b with the level threshold. Also, the communication unit division organization information addition means 105 may have a level change amount threshold and derive the start position and end position by comparing the level change amount of the waveform signal 201b with the level change amount threshold.

The communication unit synchronization determination means 106 extracts one piece of message communication unit division organization information 300a1 included in the notified division organization information-added communication message 200a and one piece of the waveform communication unit division organization information 300b1 included in the notified division organization information-added waveform signal 200b, and creates a set of the extracted pieces of information.

If the division time 3014 included in the extracted message communication unit division organization information 300a1 and the division time 3014 included in the extracted waveform communication unit division organization information 300b1 meet the communication unit synchronization determination condition 1061 to be described later, the communication unit synchronization determination means 106 stores each information's basic ID 3012 in the other information's association ID 3021, as shown in FIG. 5.

Also, the communication unit synchronization determination means 106 sets the communication unit synchronization determination flag 203a2 included in the division organization information-added communication messages 200a and the communication unit synchronization determination flag 203b2 included in the division organization information-added waveform signal 200b.

The communication unit synchronization determination means 106 repeatedly performs this process with respect to all sets of message communication unit division organization information 300a1 and waveform communication unit division organization information 300b1.

The above-mentioned communication unit synchronization determination condition 1061 may be, for example, "the difference between the division times 3014 is equal to or smaller than a threshold" or "a value obtained by adding an offset to the difference between the division times 3014 is equal to or smaller than a threshold."

The threshold may be a constant value, or different values may be set for communication protocols included in the division organization information-added communication message 200a.

The modulation unit division organization information addition means 107 sets the modulation unit extraction flag 203a3 included in the notified division organization information-added communication message 200a.

Then, the modulation unit division organization information addition means 107 derives the start position and end position and the start time and end time of the modulation unit included in the communication message 201a on the basis of the measurement data type 3015, division position 3013, and division time 3014 included in the message communication unit division organization information 300a1.

If the modulation unit division organization information addition means 107 succeeds in the derivation, it generates message modulation unit division organization information 300a2 and stores basic information 301.

Specifically, the modulation unit division organization information addition means 107 generates a basic ID 3012 unique to the message modulation unit division organization information 300a2 and stores the generated basic ID 3012, stores the start position and end position in the division position 3013, and stores the start time and end time in the division time 3014.

If the division position 3013 included in the message modulation unit division organization information 300a2 is included in the division position 3013 included in the message communication unit division organization information 300a1, the modulation unit division organization information addition means 107 copies the measurement data type 3015 included in the message communication unit division organization information 300a1 to the measurement data type 3015 included in the message modulation unit division organization information 300a2 so that the basic ID 3012 of the message modulation unit division organization information 300a2 becomes an ID that is cross-referential with the basic ID 3012 of the message communication unit division organization information 300a1.

As shown in FIG. 5, the above-mentioned cross-referential IDs may be realized, for example, by defining basic IDs 3012 as hierarchical IDs and incorporating the basic ID 3012 of the message communication unit division organization information 300a1 into the basic IDs 3012 of the pieces of message modulation unit division organization information 300a2. Also, the above-mentioned cross-referential IDs may be realized, for example, by defining basic IDs 3012 as numerical values having a digit unique to the division unit 3011 and giving an identical value to the respective digits where the division unit 3011 is the communication unit, of the basic ID 3012 included in the message communication unit division organization information 300a1 and the basic IDs 3012 included in the message modulation unit division organization information 300a2.

Also, the modulation unit division organization information addition means 107 sets the modulation unit extraction flag 203b3 included in the notified division organization information-added waveform signal 200b.

Then, the modulation unit division organization information addition means 107 derives the start position and end position and the start time and end time of the modulation unit included in the waveform signal 201b with respect to a piece of waveform communication unit division organization information 300b1 including an association ID 3021 among the pieces of waveform communication unit division organization information 300b1 included in the division organization information-added waveform signal 200b, on the basis of the measurement data type 3015 of a piece of message communication unit division organization information 300a1 having a basic ID 3012 stored in the association ID 3021 and on the basis of the division position 3013 and division time 3014 included in the piece of waveform communication unit division organization information 300b1.

If the modulation unit division organization information addition means 107 succeeds in the derivation, it generates waveform modulation unit division organization information 300b2 and stores basic information 301.

Specifically, the modulation unit division organization information addition means 107 generates a basic ID 3012 unique to the waveform modulation unit division organization information 300b2 and stores the basic ID 3012, stores the start position and end position in the division position 3013, and stores the start time and end time in the division time 3014.

If the division position included in the waveform modulation unit division organization information 300b2 is included in the division position included in the waveform communication unit division organization information 300b1, the modulation unit division organization information addition means 107 makes the basic ID 3012 of the waveform modulation unit division organization information 300b2 an ID that is cross-referential with the basic ID 3012 of the waveform communication unit division organization information 300b1.

As shown in FIG. 5, the above-mentioned cross-referential IDs may be realized, for example, by defining basic IDs 3012 as hierarchical IDs and incorporating the basic ID 3012 of the waveform communication unit division organization information 300b1 into the basic IDs 3012 of the pieces of the waveform modulation unit division organization information 300b2. Also, the above-mentioned cross-referential IDs may be realized, for example, by defining basic IDs 3012 as numerical values having a digit unique to the division unit and giving an identical value to the respective digits where the division unit is the communication unit, of the basic ID 3012 included in the waveform communication unit division organization information 300b1 and the basic IDs 3012 included in the waveform modulation unit division organization information 300b2.

The modulation unit synchronization determination means 108 extracts a piece of waveform communication unit division organization information 300*b*1 including, as an association ID 3021, the basic ID 3012 of a piece of message communication unit division organization information 300*a*1 included in the notified division organization information-added communication message 200*a*, from the notified division organization information-added waveform signal 200*b*.

If the modulation unit synchronization determination means 108 succeeds in the extraction, it extracts one piece of message modulation unit division organization information 300*a*2 referred to by the message communication unit division organization information 300*a*1 and one piece of message modulation unit division organization information 300*a*2 referred to by the extracted waveform communication unit division organization information 300*b*1, and creates a set of the extracted pieces of information.

If the division times 3014 included in the message modulation unit division organization information 300*a*2 and waveform modulation unit division organization information 300*b*2 forming this set meet the modulation unit synchronization determination condition 1081 to be described later, the modulation unit synchronization determination means 108 stores each information's basic ID 3012 in the other information's association ID 3021 as shown in FIG. 5, and sets a modulation unit synchronization determination flag 203*a*4 included in the division organization information-added communication message 200*a* and a modulation unit synchronization determination flag 203*b*4 included in the division organization information-added waveform signal 200*b*.

The modulation unit synchronization determination means 108 repeatedly performs this process with respect to all the pieces of message communication unit division organization information 300*a*1.

The above-mentioned modulation unit synchronization determination condition 1081 may be, for example, "the difference between the division times 3014 is equal to or smaller than a threshold" or "a value obtained by adding an offset to the difference between the division times 3014 is equal to or smaller than a threshold."

The threshold may be a constant value, or a different value may be set for the measurement data type 3015 included in each message communication unit division organization information 300*a*1.

The communication analysis means 109 sets a communication analysis flag 203*a*5 included in the notified division organization information-added communication message 200*a* and performs the following process with respect to all the communication analyzers 1091 included in the communication analysis means 109.

The communication analyzer label 10911 of a communication analyzer 1091 is a label unique to the communication analyzer 1091. The communication analysis subject 10912 contains the communication protocol of the communication analyzer 1091.

If the communication analysis subject 10912 included in a communication analyzer 1091 matches the measurement data type 3015 included in a piece of message communication unit division organization information 300*a*1 included in the notified division organization information-added communication message 200*a*, the communication analysis means 109 inputs a communication message 201*a* included in a range indicated by the division position 3013 of the piece of message communication unit division organization information 300*a*1, into the communication analyzer 1091.

Then, the communication analysis means 109 stores the output result of the communication analyzer 1091 in the analysis value 3032 of the message communication unit division organization information 300*a*1 and stores a unique communication analyzer label 10921 included in the communication analyzer 1091 in the analysis label 3031 of the message communication unit division organization information 300*a*1.

The waveform analysis means 110 sets a waveform analysis flag 203*b*5 included in the notified division organization information-added waveform signal 200*b* and performs the following process with respect to all the waveform analyzers 1101 included in the waveform analysis means 110.

The waveform analyzer label 11011 of a waveform analyzer 1101 is a label unique to the waveform analyzer 1101. The waveform analysis subject 11012 contains the communication protocol of the waveform analyzer 1101. Also, the waveform analysis unit 11013 contains information whether the analysis unit of the waveform analyzer 1101 is the communication unit or modulation unit.

The waveform analysis means 110 extracts a piece of waveform communication unit division organization information 300*b*1 that includes an association ID 3021 and where the measurement data type 3015 of a piece of message communication unit division organization information 300*a*1 having a basic ID 3012 stored in the association ID 3021 matches the waveform analysis subject 11012 included in a waveform analyzer 1101, among the pieces of waveform communication unit division organization information 300*b*1 included in the division organization information-added waveform signal 200*b*.

If the waveform analysis unit 11013 included in the above-mentioned waveform analyzer 1101 is the communication unit, the waveform analysis means 110 inputs a waveform signal 201*b* included in a range indicated by the division position 3013 included in the waveform communication unit division organization information 300*b*1, into a selected waveform analyzer 1101.

Then, the waveform analysis means 110 stores the output result of the waveform analyzer 1101 in the analysis value 3032 of the waveform communication unit division organization information 300*b*1 and stores the waveform analyzer label 11011 of the waveform analyzer 1101 in the analysis label 3031.

On the other hand, if the waveform analysis unit 11013 included in the above-mentioned waveform analyzer is the modulation unit, the waveform analysis means 110 inputs waveform signals 201*b* included in ranges indicated by the division positions 3013 included in all pieces of waveform modulation unit division organization information 300*b*2 referred to by the waveform communication unit division organization information 300*b*1, into a selected waveform analyzer 1101.

Then, the waveform analysis means 110 stores the output result of the waveform analyzer 1101 in the analysis value 3032 of the waveform modulation unit division organization information 300*b*2 and stores the waveform analyzer label 11011 of the waveform analyzer 1101 in the analysis label 3031.

Next, the analysis result display procedure 1C will be described.

Each time a generation subject range 202*c*2 to be described later is specified, the division organization information-added display data generation means 111 generates division organization information-added display data 200*c* with respect to all display data generators 1111 included in the division organization information-added display data generation means 111 and stores the display data label 11111 and generation subject range 202*c*2 of each display data generator 1111 in the corresponding division organization information-added display data 200*c* as measurement data information 202.

The division organization information-added display data generation means 111 has a display data generator 1111 at least for each of the above-mentioned communication analyzers 1091 and waveform analyzers 1101. The display data label 11111 of a waveform analyzer 1101 is a label unique to the corresponding display data generator 1111. The generation subject 11112 contains information indicating an analysis label 3031 corresponding to an analysis value 3032 convertible by the display data generator 1111. The generation unit 11113 contains information indicating whether a division unit 3011 convertible by the display data generator 1111 is the communication unit or modulation unit.

Also, the division organization information-added display data generation means 111 extracts a piece of division organization information-added communication messages 200a that is included in the generation subject range 202c2 and where a communication analysis flag 203a5 is set, from the division organization information-added communication message storage means 103.

Then, the division organization information-added display data generation means 111 extracts a piece of message communication unit division organization information 300a1 and a piece of message modulation unit division organization information 300a2 included in the extracted division organization information-added communication message 200a.

Also, the division organization information-added display data generation means 111 extracts, from the division organization information-added waveform signal storage means 104, a piece of waveform communication unit division organization information 300b1 indicated by a basic ID 3012 stored in the association ID 3021 of the extracted message communication unit division organization information 300a1 of the division organization information-added communication message 200a and a piece of waveform modulation unit division organization information 300b2 indicated by a basic ID 3012 stored in the association ID 3021 of the extracted message modulation unit division organization information 300a2 of the division organization information-added communication message 200a.

The division organization information-added display data generation means 111 performs the following process with respect to all of the extracted message communication unit division organization information 300a1, message modulation unit division organization information 300a2, waveform communication unit division organization information 300b1, and waveform modulation unit division organization information 300b2 (hereafter collectively referred to as "extracted division organization information 300").

The division organization information-added display data generation means 111 inputs the division organization information 300 into a display data generator 1111 having a generation unit 11113 matching the division unit 3011 of the extracted division organization information 300 and having a generation subject 11112 matching the analysis label 3031 of the extracted division organization information 300.

The display data generator 1111 generates display data 201c by converting an analysis value 3032 corresponding to the analysis label 3031 included in the inputted division organization information 300. Then, the display data generators 1111 stores, as measurement data 201, the generated display data 201c in division organization information-added display data 200c including the display data label 11111 of the display data generator 1111.

Each time the display data 201c is stored in the division organization information-added display data 200c by a display range number to be described later, the display data generators 1111 generate display division organization information 300c1 using the display range number as the division unit 3011, in the division organization information-added display data 200c. Then, the display data generators 1111 generate and store a basic ID 3012 unique to this display division organization information 300c1, store the start position and end position in the division position 3013, and stores, in the association ID 3021, all the basic IDs 3012 included in the inputted division organization information 300 that is the generation source of the display data 201c.

Also, each time the display data 201c is stored in the division organization information-added display data 200c by a selection range number to be described later, the display data generator 1111 generate selection division organization information 300c2 using the selection range number as the division unit 3011, in the division organization information-added display data 200c. Then, the display data generator 1111 generate and store a basic ID 3012 unique to this selection division organization information 300c2, store the start position and end position in the division position 3013, and store, in the association ID 3021, all the basic IDs 3012 included in the inputted division organization information 300 that is the generation source of the data for selection.

Also, if a division position 3013 included in the selection division organization information 300c2 is included in the division position 3013 included in the display division organization information 300c1, the basic ID 3012 of the selection division organization information 300c2 is considered as an ID that is cross-referential with the basic ID 3012 of the display division organization information 300c1.

The above-mentioned cross-referential IDs may be realized by defining basic ID 3012s as hierarchical IDs and incorporating the basic ID 3012 of the display division organization information 300c1 into the basic ID 3012 of the selection division organization information 300c2. Also, the above-mentioned cross-referential IDs may be realized by defining basic IDs 3012 as numerical values having a digit unique to the division unit 3011 and giving an identical value to the digits where the division unit 3011 is a display range number, of the basic ID 3012 of the display division organization information 300c1 and the basic ID 3012 of the selection division organization information 300c2.

When the division organization information-added display data generation means 111 completes the process with respect to all of the extracted division organization information 300, it notifies the division organization information-added display data storage means 112 of the division organization information-added display data 200c.

The above-mentioned generation subject range 202c2 may be a time range or a list of basic IDs 3012 included in the division organization information 300.

Also, the generation subject range 202c2 may be specified automatically periodically or may be specified manually using an operation means.

The division organization information-added display data storage means 112 stores the notified division organization information-added display data 200c.

The display data specification means 113 specifies a display data label 11111 and notifies the association ID display data extraction means 114 of the display data label 11111, display range data that is display data 201c having a format generated by a display data generator 1111 having the display data label 11111 and that has a data width equal to that of a display range number included in the display data generator 1111, and selection data having a data width equal to that of a selection range number included in the display data generator 1111.

The association ID display data extraction means 114 refers to a piece of division organization information-added display data 200c having a display data label 11111 specified by the display data specification means 113 among pieces of division organization information-added display data 200c stored by the division organization information-added display data storage means 112, and performs the following process.

The association ID display data extraction means 114 extracts all other pieces of display division organization information 300c1 including, as association IDs 3021, one or more association IDs 3021 included in a piece of display division organization information 300c1 corresponding to the specified display range data, extracts display data 201c included in a range indicated by each of the extracted pieces of display division organization information 300c1, and notifies an analysis result display means 115 having the specified display data label 11111 of the extracted display data 201c as new display range data.

The association ID display data extraction means 114 extracts all other pieces of selection division organization information 300c2 including, as association IDs 3021, one or more association IDs 3021 included in a piece of selection division organization information 300c2 corresponding to the specified selection range data, extracts display data 201c included in a range indicated by a division position included in each of the extracted other pieces of selection division organization information 300c2, and notifies an analysis result display means 115 having the specified display data label 11111 of the extracted display data 201c as new selection range data.

The analysis result display means 115 displays the notified new display range data and displays the new selection data in such a manner that the new selection data is distinguished from other data, for example, in a highlighted manner.

As a highlighting method, the new selection data may be displayed using a remarkable color, the sizes of points or lines may be enlarged, or animation may be used.

As described above, in this embodiment, division organization information-added communication message 200a and a division organization information-added waveform signal 200b are generated, division organization information 300 where the division organization information-added communication message (200a) and division organization information-added waveform signal 200b are associated with each other is extracted, division organization information-added display data 200c is generated on the basis of the extracted division organization information 300, and the display data display data 201c corresponding to the display division organization information 300c1 or selection division organization information 300c2 is displayed. Thus, a communication message and a waveform signal can be analyzed in such a manner that the communication message and waveform signal are associated with each other.

Also, by specifying a generation subject range 202c2, display data 201c corresponding to the specified range is displayed. This allows analyzing a transmission path automatically. Therefore, a user can easily identify a cause of a transmission failure or a failure occurrence location so as to address the transmission failure even if the user does not have expertise or experience about communication protocols or waveform signals.

Also, the communication analysis apparatus 100 includes the multiple communication analysis means 109 and multiple waveform analysis means 110 so that one piece of data can be analyzed using the multiple analysis means. This allows analyzing a particular signal intensively from many fronts. Thus, it is expected that the accuracy and efficiency of analysis work will be improved.

Second Embodiment

Figure 6:
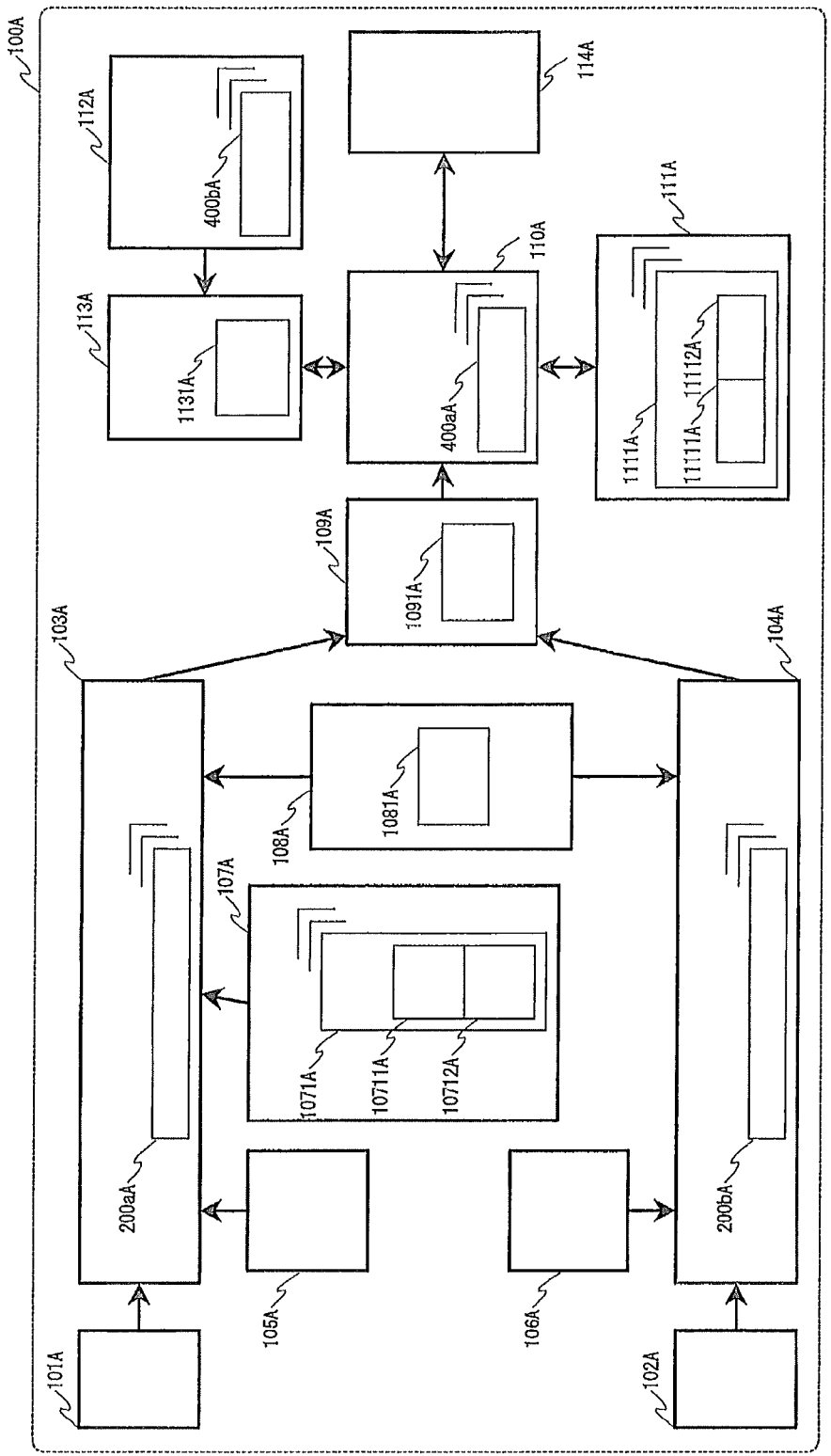
FIG. 6 is a block diagram showing a configuration of a communication analysis apparatus 100A according to a second embodiment of the present invention.

FIG. 6 is a block diagram showing a configuration of a communication analysis apparatus 100A according to a second embodiment of the present invention.

The communication analysis apparatus 100A includes a communication means 101A, a waveform measuring means 102A, a division organization information-added communication message storage means 103A, a division organization information-added waveform signal storage means 104A, a message division organization information addition means 105A, a waveform division organization information addition means 106A, a message analysis means 107A, a synchronization determination means 108A, an analysis waveform information generation means 109A, an analysis waveform information storage means 110A, a waveform characteristic amount calculation means 111A, an ideal waveform information storage means 112A, a communication state determination means 113A, and an analysis result display means 114A.

The division organization information-added communication message storage means 103A stores one or more division organization information-added communication messages 200aA. The division organization information-added waveform signal storage means 104A stores one or more division organization information-added waveform signals 200bA. The message analysis means 107A includes one or more message analyzers 1071A. The message analyzers 1071A include a message analyzer label 10711A and a message analysis subject 10712A. The synchronization determination means 108A has a synchronization determination condition 1081A. The analysis waveform information storage means 110A stores one or more pieces of analysis waveform information 400aA. The waveform characteristic amount calculation means 111A includes one or more characteristic amount calculators 1111A. The characteristic amount calculators 1111A include a calculator label 11111A and calculation subject data 11112A. The ideal waveform information storage means 112A stores one or more pieces of ideal waveform information 400bA.

Figure 7:
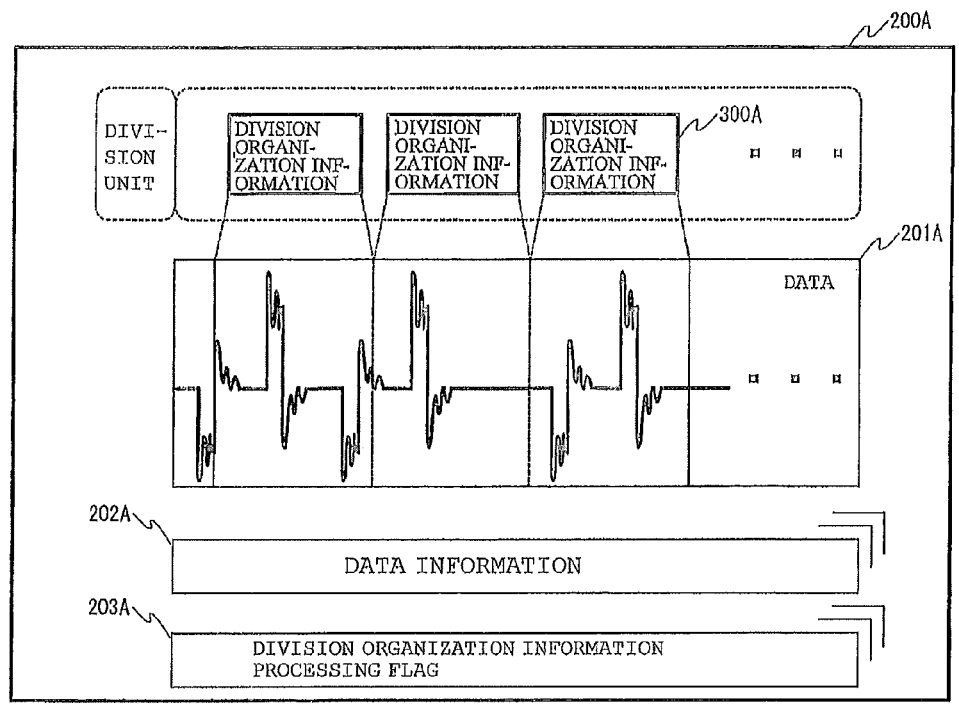
FIG. 7 is a diagram showing a configuration of division organization information-added data 200A.

FIG. 7 is a diagram showing a configuration of division organization information-added data 200A.

The division organization information-added data 200A includes zero or more pieces of division organization information 300A, one piece of data 201A, zero or more pieces of data information 202A, and zero or more division organization information processing flags 203A.

Figure 8:
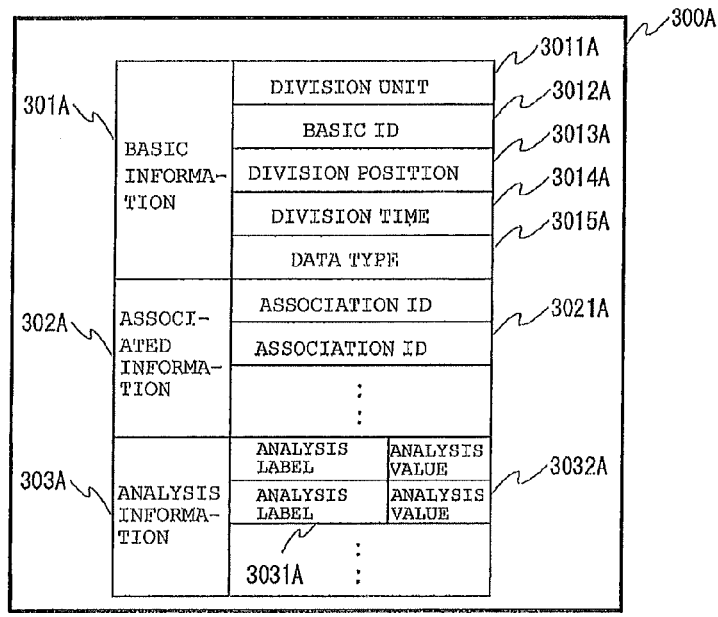
FIG. 8 is a diagram showing a configuration of division organization information 300A.

FIG. 8 is a drawing showing a configuration of the division organization information 300A.

The division organization information 300A includes basic information 301A, analysis information 303A, and association information 302A.

The basic information 301A includes a division unit 3011A, a basic ID 3012A, a division position 3013A, a division time 3014A, and a data type 3015A. The association information 302A includes zero or more association IDs 3021A. The analysis information 303A includes zero or more sets of an analysis label 3031A and an analysis value 3032A.

Configurations of the division organization information-added communication message 200aA and division organization information-added waveform signal 200bA imitate a configuration of the division organization information-added data 200A.

Specifically, the division organization information-added communication message 200aA includes message division organization information 300aA as the division organization information 300A, a communication message 201aA as the data 201A, a message acquisition time 202a1A as the data information 202A, and a communication unit extraction flag 203a1A, a message analysis flag 203a2A, and a synchronization determination flag 203a3A as division organization information processing flags 203A.

The division organization information-added waveform signal 200bA includes waveform division organization information 300bA as the division organization information 300A, a waveform signal 201bA as the data 201A, a waveform acquisition time 202b1A and a sampling rate 202b2A as the data information 202A, and a communication unit extraction flag 203b1A and a synchronization determination flag 203b2A as division organization information processing flags 203A.

Next, operations of the communication analysis apparatus 100A will be described.

Processes performed by the communication analysis apparatus 100A are broadly classified into four procedures: a communication message acquisition and analysis procedure 1A; a waveform signal acquisition and synchronization procedure 1B; an analysis waveform information generation procedure 1C; and a communication state determination procedure 1D. Hereafter, the above-mentioned procedures 1A to 1D will be described.

The message acquisition and analysis procedure 1A will be described.

The communication means 101A is connected to a wired or wireless transmission path. The communication means 101 acquires a communication message 201aA transmitted or received by an apparatus connected to the transmission path, records a message acquisition time 202a1A indicating the time when the communication message 201aA has been acquired, and notifies the division organization information-added communication message storage means 103A of the communication message 201aA and message acquisition time 202a1A.

The communication analysis apparatus 100A may include one or more communication means 101A and each communication means 101A may acquire the communication message 201aA adhering to a different communication protocol.

Each time the division organization information-added communication message storage means 103A is notified of the communication message 201aA, it newly generates the division organization information-added communication message 200aA, stores and memorizes the communication message 201aA and message acquisition time 202a1A.

Also, the division organization information-added communication message storage means 103A notifies the message division organization information addition means 105A of a division organization information-added communication message 200aA where the communication unit extraction flag 203a1A is not set, among the division organization information-added communication messages 200aA. The division organization information-added communication message storage means 103A notifies the message analysis means 107A of a division organization information-added communication message 200aA where the communication unit extraction flag 203a1A is set and the message analysis flag 203a2A is not set. The division organization information-added communication message storage means 103 notifies the synchronization determination means 108A of a division organization information-added communication message 200aA where the message analysis flag 203a2A is set and the synchronization determination flag 203a3A is not set. The division organization information-added communication message storage means 103A notifies the analysis waveform information generation means 109A of a division organization information-added communication message 200aA where the synchronization determination flag 203a3A is set.

The message division organization information addition means 105A sets the communication unit extraction flag 203a1A of the division organization information-added communication message 200aA that is notified of by the division organization information-added communication message storage means 103A and where the communication unit extraction flag 203a1A is not set, so as to derive the start position and end position of the communication unit included in the communication message 201aA and a communication protocol adhered to by the communication message 201aA. Each time the start position and end position are derived, the message division organization information addition means 105A generates the message division organization information 300aA and stores the basic information 301A. Specifically, the message division organization information addition means 105A generates the basic ID 3012A unique to the message division organization information 300aA, derives a start time corresponding to the start position and an end time corresponding to the end position on the basis of the message acquisition time 202a1A, stores the basic ID 3012A, stores the start position and end position in the division position 3013A, stores the start time and end time in the division time 3014A, and stores the communication protocol in the data type 3015A.

As for the start position and end position, the message division organization information addition means 105A may derive these positions from a downtime of the communication message 201aA or by extracting a start bit and a stop bit. As for the communication protocol, the message division organization information addition means 105A may include a table for associating communication message header formats and communication protocols with each other and may derive the communication protocol by referring to the table. Also, the communication analysis apparatus 100A may include a communication means 101A for each communication protocol and the message division organization information addition means 105A may derive the communication protocol by distinguishing a communication means 101A that is the source of the communication message 201aA.

The message analysis means 107A sets the message analysis flag 203a2A included in the division organization information-added communication message 200aA that is notified by the division organization information-added communication message storage means 103A and where the communication unit extraction flag 203a1A is set and the message analysis flag 203a2A is not set, and performs the following process with respect to all the message analyzers 1071A included in the message analysis means 107A.

If the message analysis subject 10712A of the message analyzer 1071A matches the data type 3015A of the message division organization information 300aA, the message analysis means 107A inputs, into the message analyzer 1071A, a communication message 201aA included in a range indicated by the start position and end position stored in the division position 3013A of the message division organization information 300aA, stores the output result of the message analyzer 1071A in the analysis value 3032A of the message division organization information 300aA, and stores the message analyzer label 10711A of the message analyzer 1071A in the analysis label 3031A.

The message analyzer 1071A may be an address analyzer for deriving the destination address and source address of the communication message or may be a CRC error determination apparatus for deriving a CRC error of the communication message.

The waveform signal acquisition and synchronization procedure 1B will be described.

The waveform measuring means 102A is connected to a wired or wireless transmission path. The communication means 101 acquires a waveform signal 201bA transmitted or received by an apparatus connected to the transmission path at an arbitrary sampling rate 202b2A one after another, records a waveform acquisition time 202b1A indicating the time when the waveform signal 201bA has been acquired, and notifies the division organization information-added waveform signal storage means 104A of the waveform signal 201bA, waveform acquisition time 202b1A, and sampling rate 202b2A.

The communication analysis apparatus 100A may include one or more waveform measuring means 102A and each waveform measuring means 102A may acquire the waveform signal 201bA having the different sampling rate 202b2A.

Each time the division organization information-added waveform signal storage means 104A is notified of the waveform signal 201bA, it newly generates the division organization information-added waveform signal 200bA, and stores and memorizes the waveform acquisition time 202b1A, waveform acquisition time 202b1A, and sampling rate 202b2A.

Also, the division organization information-added waveform signal storage means 104A notifies the waveform division organization information addition means 106A of a division organization information-added waveform signal 200bA where the communication unit extraction flag 203b1A is not set, among the division organization information-added waveform signals 200bA, notifies the synchronization determination means 108A of a division organization information-added waveform signal 200bA where the communication unit extraction flag 203b1A is set, and notifies the analysis waveform information generation means 109A of a division organization information-added waveform signal 200bA where the synchronization determination flag 203b2A is set.

The waveform division organization information addition means 106A sets the communication unit extraction flag 203b1A of the division organization information-added waveform signal 200bA that is notified by the division organization information-added communication message storage means 103A and where the communication unit extraction flag 203b1A is not set, and derives the start position and end position of the communication unit from the waveform signal 201bA. Each time the start position and end position are extracted, the waveform division organization information addition means 106A generates the waveform division organization information 300bA and stores the basic information 301A included in the waveform division organization information 300bA. Specifically, the waveform division organization information addition means 106A generates the basic ID 3012A unique to the waveform division organization information 300bA, derives the start time corresponding to the start position and the end time corresponding to the end position on the basis of the waveform acquisition time 202b1A and sampling rate 202b2A, sets the communication unit for the division unit 3011A, stores the basic ID 3012A, stores the start position and end position in the division position 3013A, and stores the start time and end time in the division time 3014A.

As for the start position and end position, the waveform division organization information addition means 106A may have a level threshold and derive these positions by comparing the level of the waveform signal 201bA with the level threshold. Also, the message division organization information addition means 105A may have a level change amount threshold and derive the start position and end position by comparing the level change amount of the waveform signal 201bA with the level change amount threshold.

The synchronization determination means 108A extracts one of the pieces of message division organization information 300aA included in the division organization information-added communication message 200aA that is notified by the division organization information-added communication message storage means 103A and where the synchronization determination flag 203a3A is not set, extracts one of the pieces of waveform division organization information 300bA included in the division organization information-added waveform signal 200bA that is notified by the division organization information-added waveform signal storage means 104A and where the synchronization determination flag 203b2A is not set, and creates a set of the extracted pieces of information. If the division times 3014A of the message division organization information 300aA and the waveform division organization information 300bA meet the synchronization determination condition 1081, the synchronization determination means 108A stores each information's basic ID 3012 in the other information's association ID 3021A, and sets the modulation unit extraction flag 203a3 included in the division organization information-added communication message 200aA and the synchronization determination flag 203b2A included in the division organization information-added waveform signal 200bA. The synchronization determination means 108A repeatedly performs this process with respect to all sets of message division organization information 300aA and waveform division organization information 300bA.

Figure 9:
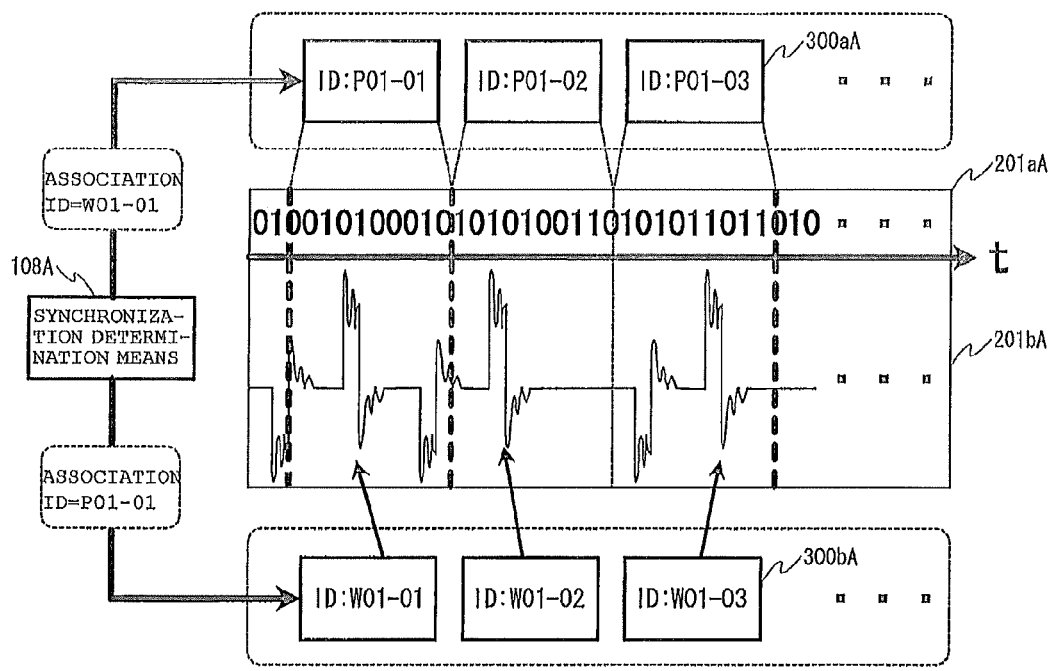
FIG. 9 is a conceptual diagram showing a method by which synchronization determination means 108A associates a communication message 201aA and a waveform signal 201bA with each other using the division organization information 300A.

This aspect is shown in FIG. 9. The association between a communication message 201aA and a waveform signal 201bA using division organization information 300A will be described specifically using FIG. 9.

The synchronization determination means 108A extracts one piece of message division organization information 300aA included in the division organization information-added communication message 200aA that is notified by the division organization information-added communication message storage means 103A and where a synchronization determination flag 203a3A is not set and one piece of waveform division organization information 300bA included in the division organization information-added waveform signal 200bA that is notified by the division organization information-added waveform signal storage means 104A and where the synchronization determination flag 203b2A is not set, and creates a set of the extracted pieces of information. If the division times 3014A of the message division organization information 300aA and the waveform division organization information 300bA meet the synchronization determination condition 1081, the synchronization determination means 108A stores the basic ID 3012A=P01-01 of the message division organization information 300aA in the association ID 3021A of the waveform division organization information 300bA, and stores the basic ID 3012A=W01-01 of the division organization information 300bA in the association ID 3021A of the division organization information 300aA.

Subsequently, as such, if the division times 3014A of the message division organization information 300aA and the waveform division organization information 300bA meet the synchronization determination condition 1081A, the synchronization determination means 108A stores the basic ID 3012A=P01-02 of the message division organization information 300aA in the association ID 3021A of the waveform division organization information 300bA, and stores the basic ID 3012A=W01-02 of the division organization information 300bA in the association ID 3021A of the division organization information 300aA.

Subsequently, as such, if the division times 3014A of the message division organization information 300aA and the waveform division organization information 300bA meet the synchronization determination condition 1081A, the synchronization determination means 108A stores the basic ID 3012A=P01-03 of the message division organization information 300aA in the association ID 3021A of the waveform division organization information 300bA, and stores the basic ID 3012A=W01-03 of the division organization information 300bA in the association ID 3021A of the division organization information 300aA.

Hereafter, the same operations will repeatedly be performed.

The synchronization determination condition 1081A may be, for example, "the difference between the division times is equal to or smaller than a threshold" or "a value obtained by adding an offset to the difference between the division times is equal to or smaller than a threshold." The threshold may be a constant value, or a different value may be set for each of the communication protocols included in the division organization information-added communication message 200aA.

The analysis waveform information generation procedure 1C will be described.

Figure 10:
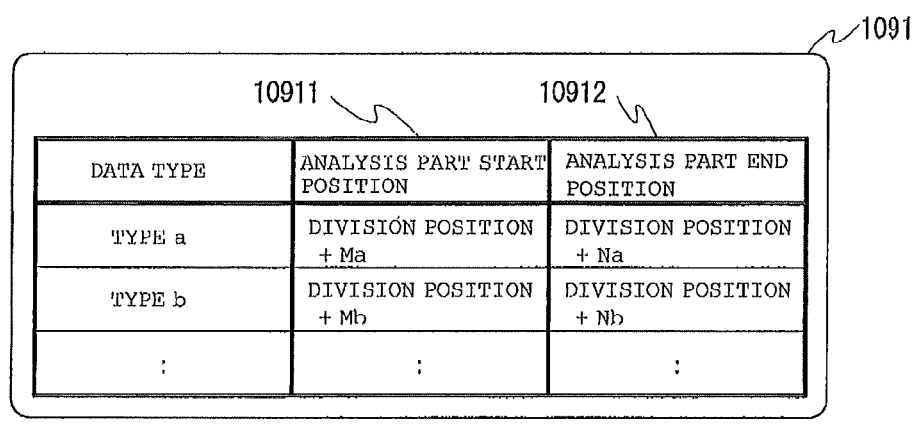
FIG. 10 is a drawing showing a configuration of an analysis part determination table 1091A.
Figure 11:
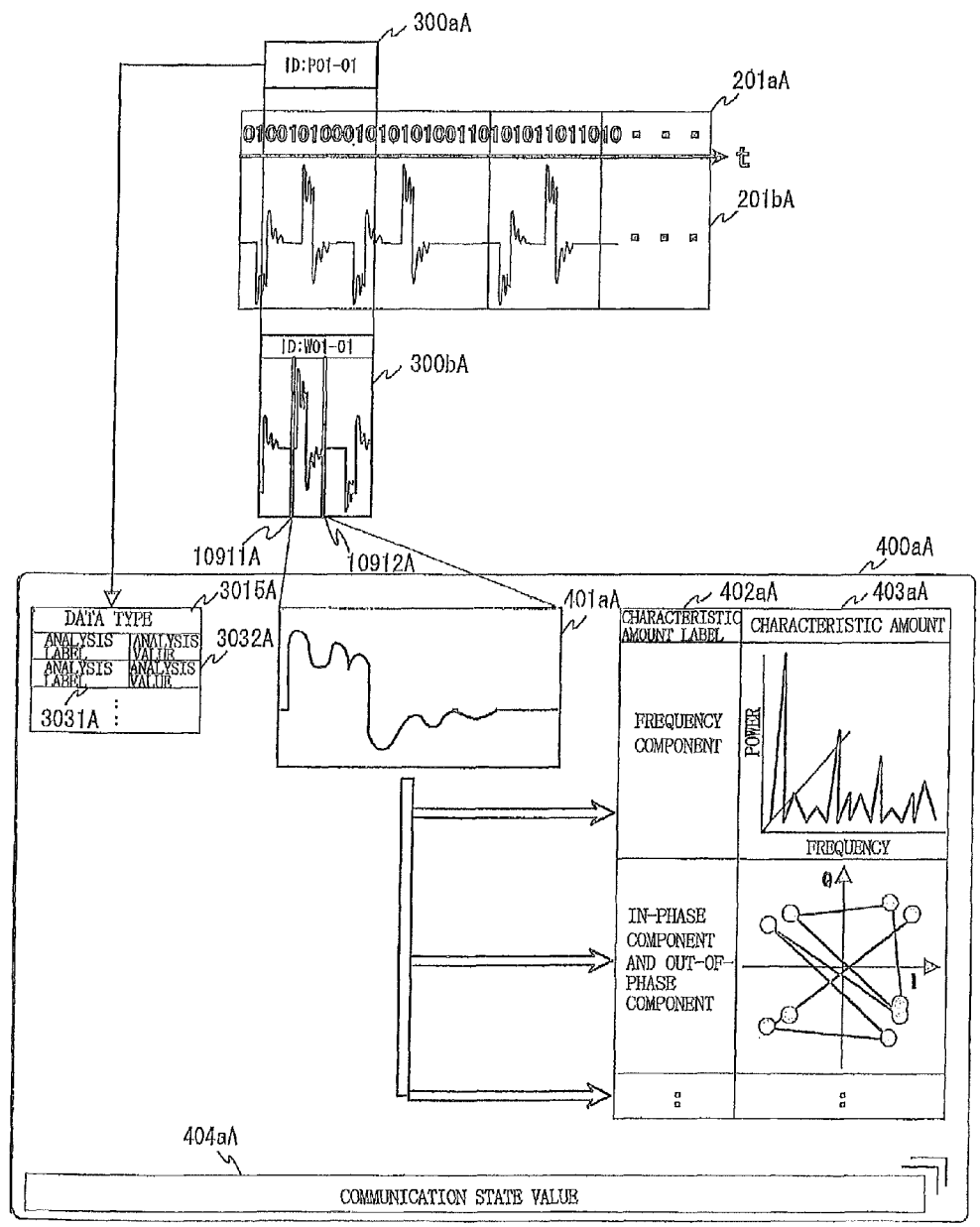
FIG. 11 is a conceptual diagram showing a generation process and a configuration of analysis waveform information 400aA.

The analysis waveform information generation means 109A refers to the message division organization information 300aA that is notified by the division organization information-added waveform signal storage means 104A and includes, as the basic ID 3012A, the association ID 3021A of the waveform division organization information 300bA included in the division organization information-added waveform signal 200bA, so as to acquire a data type 3015A, an analysis label 3031A, and an analysis value 3032A. Subsequently, the analysis waveform information generation means 109A acquires an analysis part start position and an analysis part end position by referring to an analysis part determination table 1091A shown in FIG. 10 using the data type 3015A and the division position 3013A included in the waveform division organization information 300bA as index keys for search, and extracts, as an analysis part waveform signal 401aA, a waveform signal included in a range specified by the analysis part start position and the analysis part end position. Data included in the analysis part determination table 1091A may be set when a system is introduced. Also, data determined by accumulating a waveform signal obtained on the basis of an evaluation test conducted before a system is introduced and then obtaining statistics with respect to the accumulated waveform signals may be set. Then, each time the analysis waveform information generation means 109A extracts an analysis part waveform signal 401aA, it generates analysis waveform information 400aA as shown in FIG. 11, stores the analysis part waveform signal 401aA, data type 3015A, analysis waveform information 3031A, and analysis value 3032A in the analysis waveform information 400aA, and notifies the analysis waveform information storage means 110A of the analysis waveform information 400aA.

The analysis waveform information storage means 110A notifies the waveform characteristic amount calculation means 111A of a piece of analysis waveform information 400aA where a characteristic amount calculation flag is not set, among the pieces of analysis waveform information 400aA notified by the analysis waveform information generation means 109A, and notifies the communication state determination means 113A of a piece of analysis waveform information 400aA where a characteristic amount calculation flag is set and a communication state determination flag is not set.

The waveform characteristic amount calculation means 111A sets a characteristic amount calculation flag included in a piece of analysis waveform information 400aA that is notified by the analysis waveform information storage means 110A and where the characteristic amount calculation flag is not set, and performs the following process with respect to all the characteristic amount calculators 1111A included in the waveform characteristic amount calculation means 111A.

The waveform characteristic amount calculation means 111A selects the data type 3015A of the analysis waveform information 400aA and calculation subject data 11112a of the characteristic amount calculator 1111A that are matched.

The waveform characteristic amount calculation means 111A inputs, into the selected characteristic amount calculator 1111A, the analysis part waveform signal 401aA included in the analysis waveform information 400aA, stores the output result of the characteristic amount calculator 1111A in the characteristic amount 403aA of the analysis waveform information 400aA, and stores the calculator label 11111A of the characteristic amount calculator 1111A in the characteristic amount 402aA.

One of the characteristic amount calculators 1111A may be a Fourier transformer for deriving a frequency component of a waveform signal, an I-Q calculator for deriving an in-phase component and an out-of-phase component of a waveform signal, or an MER calculator for deriving fluctuation amounts of the in-phase component and out-of-phase component.

The communication state determination procedure 1D will be described.

The communication state determination means 113A sets a state determination flag included in analysis waveform information that is notified by the analysis waveform information storage means 110A and where a characteristic amount calculation flag is set and the communication state determination flag is not set, and acquires ideal waveform information 400bA including the data type 3015A of the analysis waveform information 400aA from the ideal waveform information storage means 112A.

The communication state determination means 113A compares the analysis waveform information 400aA with an analysis part waveform signal included in the analysis waveform information 400aA and a characteristic amount so as to obtain a comparison value. Also, the communication state determination means 113A inputs the comparison value into the communication state determination table 1131A so as to obtain a communication state value 404aA, and stores the obtained communication state value 404aA in the analysis waveform information 400aA.

The comparison value of the analysis part waveform signal may be the largest amplitude value or a difference between average values. If the characteristic amount is a frequency component, the comparison value of the characteristic amount may be a difference between power of particular frequencies. If the characteristic amount is an in-phase component and an out-of-phase component, the comparison value may be a difference between amplitude distributions or a difference between phase distributions.

The communication state value may be the aged deterioration state of a transmission/reception terminal, the name of a failure part, the length of a transmission path between transmission/reception terminals, the aged deterioration state of the transmission path, the number of terminals connected to the whole transmission path, or the name of a noise source that adds noise to the waveform signal 201bA.

The contents of these quantitative estimations are shown in FIG. 12.

The analysis result display means 114A acquires, from the analysis waveform information storage means 110A, the analysis waveform information 400aA specified automatically or in accordance with a manual instruction made by a worker. If a state determination flag of the analysis waveform information 400aA is set, the analysis result display means 114A displays the contents of the state determination flag.

Industrial Applicability

Among usage examples of the present invention is a communication abnormality analysis tool of a communication network of such as an air-conditioning system of a building.

The invention claimed is:

1. A communication analysis apparatus connected to a transmission path through which a plurality of apparatuses transmits or receives a message conforming to a predetermined communication protocol with one another, the communication analysis apparatus comprising:
    ideal waveform information storage means for retaining an ideal waveform signal conforming to the communication protocol;
    analysis waveform information generation means;
    communication state determination means; and
    waveform characteristic amount calculation means, wherein
    the analysis waveform information generation means extracts, as an analysis waveform signal, a portion corresponding to the ideal waveform signal and a time of a waveform signal received from the transmission path,
    the waveform characteristic amount calculation means calculates a characteristic amount of the analysis waveform signal and a characteristic amount of the ideal waveform signal, and
    the communication state determination means estimates a communication state of the transmission path on the basis of an analysis waveform signal extracted by the analysis waveform information generation means and an ideal waveform signal stored in the ideal waveform information storage means by comparing a characteristic amount of an analysis waveform signal outputted from the waveform characteristic amount calculation means with a characteristic amount of an ideal waveform signal.

2. The communication analysis apparatus of claim 1, wherein
    a characteristic amount calculated by the waveform characteristic amount calculation means includes a phase component at a time when the analysis waveform signal and the ideal waveform signal are partitioned into predetermined lengths.

3. The communication analysis apparatus of claim 2, wherein
    the communication state determination means compares the analysis waveform signal with the ideal waveform signal using a difference between distributions of the phase component in the predetermined lengths.

4. The communication analysis apparatus of claim 1, wherein
    a characteristic amount calculated by the waveform characteristic amount calculation means includes an amplitude component at a time when the analysis waveform signal and the ideal waveform signal are partitioned into predetermined lengths.

5. The communication analysis apparatus of claim 4, wherein
    the communication state determination means compares the analysis waveform signal with the ideal waveform signal using a difference between distributions of the amplitude component in the predetermined lengths.

6. The communication analysis apparatus of claim 1, comprising
    analysis result display means, wherein
    the analysis result display means displays a communication state of the transmission path estimated by the communication state determination means.

7. A communication analysis apparatus connected to a transmission path through which a message is transmitted or received among a plurality of apparatuses, the communication analysis apparatus comprising:
    ideal waveform information storage means for retaining an ideal waveform signal conforming to a predetermined communication protocol;
    analysis waveform information generation means;
    communication state determination means; and
    synchronization determination means, wherein
    the analysis waveform information generation means extracts, from a message received from the transmission path, a message having a communication protocol matching a communication protocol of the ideal waveform signal and a waveform signal corresponding to the message, and extracts a portion of the extracted waveform signal corresponding to the ideal waveform signal and a time as an analysis waveform signal,
    the communication state determination means estimates a communication state of the transmission path on the basis of an analysis waveform signal extracted by the analysis waveform information generation means and an ideal waveform signal stored in the ideal waveform information storage means, and
    the synchronization determination means associates a waveform signal transmitted through the transmission path and a communication message transmitted through the transmission path with each other using a time.

8. The communication analysis apparatus of claim 7, comprising
    analysis waveform information storage means, wherein
    the analysis waveform information storage means stores the analysis waveform signal and a communication message associated with the waveform signal in combination.

9. The communication analysis apparatus of claim 8, wherein
    the communication state estimated by the communication state determination means includes a state of deterioration with time of the transmission path.

10. The communication analysis apparatus of claim 8, wherein
    the communication state estimated by the communication state determination means includes a length of a transmission path linking a source terminal of the analysis waveform signal and a destination terminal thereof.

11. The communication analysis apparatus of claim 8, wherein
    the communication state estimated by the communication state determination means includes a failure part of a source terminal or a destination terminal of the analysis waveform signal.

12. The communication analysis apparatus of claim 8, wherein the communication state estimated by the communication state determination means includes the number of terminals connected to the whole transmission path.

13. The communication analysis apparatus of claim 8, wherein the communication state estimated by the communication state determination means includes a name of a noise source.

14. The communication analysis apparatus of claim 7, comprising:

communication means; and waveform measuring means, wherein the communication means receives a communication message from the transmission path and the acquisition time of the communication message one after another and notifies first storage means of the communication message and the acquisition time, the waveform measuring means receives a waveform signal from the transmission path and the acquisition time of the waveform signal one after another and notifies second storage means of the waveform signal and the acquisition time, the first storage means stores the communication message and the acquisition time thereof, the second storage means stores the waveform signal and the acquisition time thereof, and the synchronization determination means operates when a difference between the acquisition time of the communication message stored in the first storage means and the acquisition time of the waveform signal stored in the second storage means is equal to or smaller than a predetermined value.

15. The communication analysis apparatus of claim 7, comprising analysis result display means, wherein the analysis result display means displays a communication state of the transmission path estimated by the communication state determination means.

* * * * *